(12) United States Patent
Hasegawa

(10) Patent No.: US 7,304,390 B2
(45) Date of Patent: Dec. 4, 2007

(54) ANISOTROPIC CONDUCTIVE SHEET AND MANUFACTURE THEREOF

(75) Inventor: Miki Hasegawa, Aichi (JP)

(73) Assignee: J.S.T. Mfg. Co., Ltd, Osaka (JP)

(*) Notice: Subject to any disclaimer, the term of this patent is extended or adjusted under 35 U.S.C. 154(b) by 311 days.

(21) Appl. No.: 11/071,239

(22) Filed: Mar. 4, 2005

(65) Prior Publication Data
US 2005/0194697 A1    Sep. 8, 2005

(30) Foreign Application Priority Data
Mar. 5, 2004    (JP) ............................. 2004-063155

(51) Int. Cl.
H01L 23/52 (2006.01)
H01L 29/00 (2006.01)
H01R 12/00 (2006.01)

(52) U.S. Cl. .............. 257/774; 257/775; 257/777; 257/512; 257/515; 439/55; 439/63

(58) Field of Classification Search ........... 257/777, 257/774, 687; 252/512–515; 428/570, 403; 75/255; 439/55, 63
See application file for complete search history.

(56) References Cited

U.S. PATENT DOCUMENTS

| | | | | |
|---|---|---|---|---|
| 5,661,042 | A * | 8/1997 | Fang et al. | 438/17 |
| 5,918,113 | A * | 6/1999 | Higashi et al. | 438/119 |
| 6,039,896 | A * | 3/2000 | Miyamoto et al. | 252/511 |
| 6,399,282 | B1 * | 6/2002 | Kubota et al. | 430/311 |
| 6,451,875 | B1 * | 9/2002 | Suga et al. | 523/204 |
| 6,518,097 | B1 * | 2/2003 | Yim et al. | 438/119 |
| 6,752,937 | B2 * | 6/2004 | Butler | 252/511 |
| 6,987,440 | B2 * | 1/2006 | Becker et al. | 338/22 R |

(Continued)

FOREIGN PATENT DOCUMENTS

JP    6-45025 A    2/1994

(Continued)

OTHER PUBLICATIONS

Notice of Reasons for Rejection with JPO Office Action, Ref. No. J04P013, Transmission No. 025943, Jan. 23, 2007 (3 pages).

*Primary Examiner*—Howard Weiss
*Assistant Examiner*—Shrininvas H. Rao
(74) *Attorney, Agent, or Firm*—Rader, Fishman & Grauer, PLLC

(57) ABSTRACT

An anisotropic conductive sheet manufactured through improved manufacturing steps and a method of manufacturing the same. Conductive portions are unevenly arranged in a nonconductive elastomer having fluidity and serving as a matrix, the conductive portions highly densely containing the conductive particles having a specific gravity greater than that of the matrix component, the conductive particles are unevenly dispersed to form substantially nonconductive portions, and the conductive portions and the nonconductive portions are integrally cured to mold anisotropic conductive pieces. The anisotropic conductive pieces are so laminated that the conductive portions and the nonconductive portions are alternately arranged thereby to obtain a first laminate, and the first laminate is cut maintaining a predetermined thickness to obtain a zebra-like sheet. A second laminate obtained by alternately laminating the zebra-like sheets and the elastomer sheets is cut maintaining a predetermined thickness to obtain an isotropic conductive sheet in which the conductive portions are arranged like a matrix.

20 Claims, 8 Drawing Sheets

U.S. PATENT DOCUMENTS

| | | |
|---|---|---|
| 7,122,131 B2 * | 10/2006 | Satou ........................ 252/500 |
| 2005/0145974 A1 | 7/2005 | Hasegawa et al. |
| 2005/0233620 A1 | 10/2005 | Hasegawa |

FOREIGN PATENT DOCUMENTS

| | | |
|---|---|---|
| JP | 07-037432 A | 2/1995 |
| JP | 10-284156 A | 10/1998 |
| JP | 2000-340037 A | 12/2000 |
| JP | 2001-313125 A | 11/2001 |
| JP | 2004-001249 A | 1/2004 |
| WO | WO-03/079494 A1 | 9/2003 |
| WO | WO-03/079496 A1 | 9/2003 |

* cited by examiner

ANISOTROPIC CONDUCTIVE SHEET AND MANUFACTURE THEREOF

CROSS-REFERENCE TO RELATED APPLICATIONS

This application is based upon and claims the benefits of priority from Japanese Patent Application No. 2004-063155 filed on Mar. 5, 2004, the entire contents of which are incorporated herein by reference.

FIELD OF THE INVENTION

The present invention relates to an anisotropic conductive sheet, which may be interposed between a circuit board such as a printed board and various circuit parts, and to a method of manufacturing the same.

RELATED ART

The trend toward decreasing the size and thickness of modern electronic devices has required an increased necessity of connection among fine circuitry and among fine portions and fine circuitry. The method of connection is based on a solder junction technology and the use of an anisotropic conductive adhesive. There has further been employed a method of accomplishing electric conduction by interposing an anisotropic conductive elastomer sheet between the electronic part and the circuit board.

The anisotropic conductive elastomer sheet stands for an elastomer sheet having electric conductivity in a given direction. Usually, the anisotropic conductive elastomer sheet exhibits electric conductivity in the direction of the thickness only or exhibits electric conductivity in the direction of the thickness only when it is pressed in the direction of the thickness.

The anisotropic conductive elastomer sheet is capable of accomplishing a compact electric connection without using such means as soldering or mechanical coupling, providing a soft connection by absorbing mechanical shocks and distortion, and being widely used in such fields as a liquid crystal display, a cellular phone, an electronic computer, an electronic digital timepiece, an electronic camera and a regular computer.

The anisotropic conductive elastomer sheet has further been widely used as a connector for accomplishing an electric connection between, for example, a printed circuit board and a lead-less chip carrier or a liquid crystal panel.

In the electric inspection of circuit devices such as printed circuit boards and the semiconductor integrated circuits, further, the anisotropic conductive elastomer sheet is often interposed between the to-be-inspected electrode region of the circuit device and the electrode region for inspection of the circuit board for inspection in order to accomplish an electric connection between the to-be-inspected electrode formed on at least one surface of the circuit device to be inspected and the electrode for inspection formed on the surface of the circuit board for inspection.

The anisotropic conductive elastomer sheet (hereinafter abbreviated as anisotropic conductive sheet) has heretofore been obtained by thinly cutting an anisotropic conductive block prepared by integrating fine metal wires arranged in parallel by using an insulator in a direction at right angles with the fine metal wires (see, for example, JP-A-2000-340037).

There has further been invented an isotropic conductive connector (substantially an isotropic conductive sheet) which uses a conductive member comprising a conductive nonwoven fabric and a conductive rubber, and is obtained by thinly cutting a block obtained by alternately laminating an insulative rubber member and a zebra-like sheet formed of the insulative rubber member and a conductive layer of the conductive nonwoven fabric and the conductive rubbery member with the directions of the conductive layers of the zebra-like sheet being arranged in order (see, for example, JP-A-6-45025).

With the anisotropic conductive sheet disclosed in JP-A-2000-340037 which uses fine metal wires, however, it is difficult to decrease the distance among the fine metal wires. It is therefore difficult to maintain anisotropic conductivity of a fine pitch required by the modern highly integrated circuit boards and the electronic parts. Due to the compressive force through the use, further, the fine metal wires tend to be buckled and fall out after the repetitive use maintaining no longer the function of the anisotropic conductive sheet as a connector to a sufficient degree.

Further, the anisotropic conductive sheet disclosed in JP-A-6-45025 includes a step of obtaining a conductive sheet that serves as a conductive layer formed by using a conductive nonwoven fabric and a conductive rubbery member, a step of obtaining a zebra-like block by laminating many numbers of the conductive sheets obtained through the above step and insulative rubber members, and a step of obtaining a zebra-like sheet by slicing the zebra-like block obtained through the above step in the direction of lamination.

The anisotropic conductive sheet disclosed in JP-A-6-45025, further, includes a step of obtaining a matrix-like block by laminating many numbers of the zebra-like sheets obtained through the above step and the insulative rubber members, and a step of thinly slicing the matrix-like block obtained through the above step in a direction at right angles with the direction of lamination.

If the number of steps for manufacturing the anisotropic conductive sheet obtained through the above several steps can be omitted even by a small number, i.e., if the productivity can be improved, then, the anisotropic conductive sheet can be produced at a decreased cost.

SUMMARY OF THE INVENTION

In order to solve the above-mentioned issues, it is an object of the present invention to provide an anisotropic conductive sheet spreading like a plane and having conductivity in the direction of the thickness and a method of manufacturing the same, and, particularly, to an anisotropic conductive sheet obtained through improved steps of manufacturing and a method of manufacturing the same.

In order to achieve the above object, the present inventors have invented a new anisotropic conductive sheet described below and a method of manufacturing the same by unevenly arranging the conductive portions highly densely containing the conductive particles in a nonconductive elastomer which has fluidity (or is flowable) and serves as a matrix, the conductive particles having a specific gravity greater than that of the matrix component (or the base component).

(1) An anisotropic conductive sheet comprising: a predetermined thickness; a sheet surface expanding in a plane; regions on the sheet surface having good conductivity in a direction of the thickness under a predetermined condition; and a plurality of anisotropic conductive pieces having a substantially same predetermined thickness and being conductive in a direction of the thickness, wherein the plurality of anisotropic conductive pieces are bonded together directly or indirectly with respective thicknesses thereof aligned to form the plane; wherein each of the anisotropic conductive pieces have conductivity in the direction of the thickness, which varies substantially continuously in a predetermined direction on the sheet surface; and wherein the regions having the good conductivity in the direction of the thickness are provided in a discontinuous manner on the sheet surface of the anisotropic conductive sheet.

(2) The anisotropic conductive sheet according to (1), wherein the anisotropic conductive pieces comprises a nonconductive elastomer and conductive particles, the nonconductive elastomer constitutes a matrix, and the conductive particles are dispersed in the matrix; wherein the nonconductive elastomer is formed by making a flowable base component non-flowable or solidified; and wherein the conductive particles have a specific gravity greater than that of the flowable base component.

(3) The aniotropic conductive sheet according to (1) or (2), further comprising: nonconductive pieces being composed of the nonconductive elastomer, wherein the nonconductive pieces have a predetermined thickness substantially same as the thickness of the anisotropic conductive sheet, and wherein at least one of the anisotropic conductive pieces and at least one of the nonconductive pieces are bonded to each other.

(4) The anisotropic conductive sheet according to any one from (1) to (3), wherein at least one of the anisotropic conductive pieces has conductivity in the direction of the thickness, the conductivity continuously varying from a substantially nonconductive state to a good conductive state in a predetermined direction on the sheet surface.

(5) The anisotropic conductive sheet according to any one from (1) to (4), wherein the anisotropic conductive pieces has continuously varying conductivity by utilizing sedimentation of the conductive particles in the flowable base component.

(6) A method of manufacturing an anisotropic conductive sheet comprising: a sheet surface expanding in a plane and regions on the sheet surface having good conductivity in a direction of a thickness under a predetermined condition, the method comprising the steps of: preparing a plurality of gradient conductive sheets having a predetermined thickness including portions having conductivity which substantially continuously varies from a substantially nonconductive state to a good conductive state in the direction of the thickness; laminating the plurality of gradient conductive sheets and curing the laminated sheets to form a lump of laminated gradient conductive sheets; and cutting the lump of laminated gradient conductive sheets in a predetermined thickness to form zebra-like sheets, wherein, in preparing the plurality of gradient conductive sheets, to make a flowable base component non-flowable or solidifed, a density profile of conductive particles dispersed in the flowable base component is arranged to continuously vary in a direction of the thickness by sedimentation of the conductive particles, the conductive particles having a specific gravity greater than that of the flowable base component.

(7) The method according to claim (6) further comprising the steps of: laminating the zebra-like sheets and nonconductive sheets composed of nonconductive elastomer in an alternative manner to form a lump of laminated sheets, and curing the lump of alternative sheets to form a lump of laminated zebra-like-and-nonconductive sheets; cutting the lump of laminated zebra-like-and-nonconductive sheets in a predetermined thickness to form the anisotropic conductive sheet such that at least one region has good conductivity in the direction of the thickness.

Here, the term, "good conductivity" is synonymous with being substantially conductive and is used for making a distinction from simply designating a conductive property. Therefore, it can be considered that a high conductivity (especially practically high or enough high conductivity) represents a good conductivity. Further, in that the plurality of anisotropic conductive pieces are bonded together directly or indirectly with respective thicknesses thereof aligned to form the plane, the anisotropic conductive pieces are positioned in the direction of the thickness such that the thickness is arranged substantially even. And thus, the members are arranged and bonded with each other in such a manner that the bonded sheets as a whole possess a nearly uniform and predetermined thickness. Further, a region or regions having good conductivity means that the region(s) (or a predetermined area(s)) exhibits conductivity in a direction of the thickness.

(8) An anisotropic conductive sheet expanding on a plane and having conductivity in a direction of the thickness, being composed of a plurality of anisotropic conductive pieces having a predetermined thickness and conductivity in a direction of the thickness, wherein the plurality of anisotropic conductive pieces are chemically bonded each other; the plurality of anisotropic conductive pieces include conductive portions having conductivity in the direction of the thickness due to conductive particles mixed into the nonconductive elastomer that forms a matrix of the anisotropic conductive pieces and nonconductive portions having nonconductivity in the direction of the thickness and in the direction of the plane due to the nonconductive elastomer; the conductive portions and the nonconductive portions are substantially continuously joined together; and the conductive particles included in the plurality of anisotropic conductive pieces have a specific gravity greater than that of the nonconductive matrix component that exhibits fluidity or flowability at the time of molding.

(9) An anisotropic conductive sheet expanding on a plane and having conductivity in a direction of the thickness, wherein conductive portions are unevenly arranged in a nonconductive elastomer having fluidity or the flowability and serving as a matrix, the conductive portions highly densely containing the conductive particles having a specific gravity greater than that of the matrix component, the conductive particles are unevenly dispersed in the nonconductive elastomer having fluidity or flowability and serving as the matrix so that nonconductive portions are substantially continuously joined thereto, the conductive portions and the noncondctive portions are integrally cured to mold anisotropic conductive pieces, a plurality of the anisotropic conductive pieces are laminated and joined together in a manner that the conductive portions and the nonconductive portions are alternately arranged to obtain a first laminate, and the first laminate is cut in a predetermined thickness so that the conductive portions are arranged in a zebra form.

(10) An anisotropic conductive sheet expanding on a plane and having conductivity in a direction of the thickness, wherein conductive portions are unevenly arranged in a nonconductive elastomer having fluidity or flowability and serving as a matrix, the conductive portions highly densely containing the conductive particles having a specific gravity greater than that of the matrix component, the conductive particles are unevenly dispersed in the nonconductive elastomer having fluidity or flowability and serving as the matrix so that nonconductive portions are substantially continuously joined thereto, the conductive portions and the noncondctive portions are integrally cured to mold isotropic conductive pieces, a plurality of the anisotropic conductive pieces are laminated and joined together in a manner that the conductive portions and the nonconductive portions are alternately arranged thereby to obtain a first laminate or a block (or lump) of laminated sheets, the first laminate is cut or sliced in a predetermined thickness to form a zebra-like sheet with such a thickness, and a second laminate formed by alternately laminating and bonding the zebra-like sheets and the nonconductive elastomer sheets is cut in a predetermined thickness so that the conductive portions are arranged like a matrix.

(11) The anisotropic conductive sheet described in any one of (8) to (10), wherein a nonconductive sheet with the conductive portions is characterized in that the conductive portions are unevenly arranged in the nonconductive sheet and that highly densely contain the conductive particles that are sedimented in the nonconductive elastomer having fluidity or flowability and serving as a matrix, while the conductive particles have a specific gravity greater than that of the matrix component.

(12) The anisotropic conductive sheet described in any one of (8) to (11), wherein the nonconductive sheet with the conductive portions is characterized in that the conductive portions are unevenly arranged in the nonconductive sheet and that highly densely contain the conductive particles utilizing the centrifugal force in the nonconductive elastomer having fluidity or flowability and serving as a matrix, while the conductive particles have a specific gravity greater than that of the matrix component.

(13) A method of manufacturing an anisotropic conductive sheet expanding on a plane and having conductivity in a direction of the thickness, comprising: a first step of unevenly arranging the conductive portions in a nonconductive elastomer having fluidity and serving as a matrix, the conductive portions highly densely containing the conductive particles having a specific gravity greater than that of the matrix component; a second step of unevenly dispersing the conductive particles in the nonconductive elastomer having fluidity or flowability and serving as the matrix so that the nonconductive portions are substantially continuously joined thereto, and integrally curing the conductive portions and the noncondctive portions to mold isotropic conductive pieces; a third step of laminating a plurality of the anisotropic conductive pieces in a manner that the conductive portions and the nonconductive portions are alternately arranged thereby to obtain a first laminate; and a fourth step of cutting the first laminate formed in the third step maintaining a predetermined thickness to form a zebra-like sheet.

(14) A method of manufacturing an anisotropic conductive sheet expanding on a plane and having conductivity in a direction of the thickness described in (13), further comprising: a fifth step of alternately laminating the zebra-like sheets obtained through the fourth step and the nonconductive elastomer sheets to form a second laminate or a second block (or lump) of laminated sheets; and a sixth step of cutting the second laminate formed in the fifth step, the cut (or sliced) sheet having a predetermined thickness.

According to the present invention described in (8), it is described that an anisotropic conductive sheet expanding on a plane and having conductivity in a direction of the thickness, being composed of a plurality of anisotropic conductive pieces having a predetermined thickness and having conductivity in the direction of the thickness, wherein the plurality of anisotropic conductive pieces are chemically bonded together, the plurality of anisotropic conductive pieces include conductive portions having conductivity in the direction of the thickness due to the conductive particles mixed into the nonconductive elastomer that forms a matrix of the anisotropic conductive pieces and nonconductive portions having nonconductivity in the direction of the thickness and in the direction of the plane due to the nonconductive elastomer, the conductive portions and the nonconductive portions are substantially continuously joined together, and the conductive particles included in the plurality of anisotropic conductive pieces have a specific gravity greater than that of the nonconductive matrix component that exhibits fluidity at the time of molding.

The anisotropic conductive sheet of the present invention expands on a plane, and it is nonconductive in a direction expanding on the plane and conductive in a plurality of directions nearly at right angles with the direction expanding on the plane (i.e., the anisotropic conductive sheet is conductive in the direction of the thickness).

Having the conductivity means that it substantially permits the flow of electricity or means that it has a sufficiently small electric resistance. When it has the conductivity, it is desired that the resistance across the connected terminals is usually not larger than 100 $\Omega$ (preferably, not larger than 10 $\Omega$ and, more preferably, not larger than 1 $\Omega$). Nonconductive means that it does not substantially permit the flow of electricity or means that it has a sufficiently large electric resistance.

In the present invention, the nonconductive sheet comprises a nonconductive elastomer, and the nonconductive elastomer means an elestomer without conductivity or means an elastomer having a sufficiently large electric resistance.

Concrete examples of the nonconductive elastomer include a butadiene copolymer, a conjugated diene rubber such as natural rubber, polyisoprene rubber, butadiene/styrene, butadiene/acrylonitrile and butadiene/isobutylene and a hydrogenated product thereof; a block copolymer rubber such as styrene/butadiene/diene block copolymer rubber and styrene/isoprene block copolymer and a hydrogenated product thereof; and chloroprene copolymer, vinyl chloride/vinyl acetate copolymer, urethane rubber, polyester rubber, epichlorohydrin rubber, ethylene/propylene copolymer rubber, ethylene/propylene/diene copolymer rubber, soft liquid epoxy rubber, silicone rubber and fluorine-contained rubber. Among them, the silicone rubber is preferably used owing to its excellent heat resistance, cold resistance, resistance against chemicals, weatherability, electric insulation and safety. The above nonconductive elastomers usually have high volume resistivities (e.g., not smaller than 1 M$\Omega$·cm at 100 V), and are nonconductive.

The anisotropic conductive pieces may be obtained by employing, for example, the following method. As a molding material for holding the outer shape of the anisotropic conductive pieces, nonconductive elastomer that serves as a matrix (or base component having fluidity) and has fluidity at the time of molding is mixed with conductive particles which serve as a conductive element. The density of the conductive particles can be gradated in the mixture by utilizing the gravity and/or the centrifugal force and a difference in the specific gravity between the elastomer and the conductive particles. That is, upon being sedimented, the conductive particles are unevenly distributed (i.e., gathered) in the lower part of the sheet which is, then, cured to obtain anisotropic conductive pieces.

The nonconductor with the conductive portions in which the conductive particles are unevenly dispersed in the conductive portions rendering the nonconductive elastomer to be substantially nonconductive, is cut (or sliced) in the direction of lamination to obtain anisotropic conductive pieces (nonconductive sheet member with conductive portions).

The anisotropic conductive pieces have conductive portions and nonconductive portions existing in the piece surfaces, and can be preferably used for forming the anisotropic conductive sheet if they are bonded together being arranged in order in the direction of the thickness. If the conductive portions are arranged in parallel, there can be obtained a so-called zebra sheet (anisotropic conductive zebra sheet). If the conductive portions are arranged in the longitudinal and transverse directions, on the other hand, there can be obtained a so-called matrix sheet (anisotropic conductive matrix sheet).

According to the present invention described in (9), it is described that an anisotropic conductive sheet expanding on a plane and having conductivity in a direction of the thickness, wherein conductive portions are unevenly arranged in a nonconductive elastomer having fluidity or flowability and serving as a matrix, the conductive portions highly densely containing the conductive particles having a specific gravity greater than that of the matrix component, the conductive particles are unevenly dispersed in the nonconductive elastomer having fluidity or flowability and serving as the matrix so that nonconductive portions are substantially continuously joined thereto, the conductive portions and the non-condctive portions are integrally cured to mold isotropic conductive pieces, a plurality of the anisotropic conductive pieces are laminated and joined together in a manner that the conductive portions and the nonconductive portions are alternately arranged thereby to obtain a first laminate, and the first laminate is cut in a predetermined thickness so that the conductive portions are arranged in a zebra form with such a predetermined thickness.

According to the present invention described in (10), it is described that the anisotropic conductive sheet expanding on a plane and having conductivity in a direction of the thickness is provided, wherein the conductive portions are unevenly arranged in a nonconductive elastomer having fluidity or flowability and serving as a matrix, the conductive portions highly densely containing the conductive particles having a specific gravity greater than that of the matrix component; the conductive particles are unevenly dispersed in the nonconductive elastomer having fluidity or flowability and serving as the matrix so that nonconductive portions are substantially continuously joined thereto; the conductive portions and the nonconductive portions are integrally cured to mold isotropic conductive pieces, a plurality of the anisotropic conductive pieces are laminated and joined together in a manner that the conductive portions and the nonconductive portions are alternately arranged thereby to obtain a first laminate or a first block (or lump) of laminated sheets, the first laminate is cut in a predetermined thickness to form a zebra-like sheet with such a predetermined thickness, and a second laminate or a second block (or lump) of laminated sheets formed by alternately laminating and bonding the zebra-like sheets and the nonconductive elastomer sheets is cut in a predetermined thickness so that the conductive portions are arranged like a matrix.

The present invention may be characterized in that the nonconductive sheet with the conductive portions is such that the conductive portions are unevenly arranged therein highly densely containing the conductive particles that are sedimented in the nonconductive elastomer having fluidity or flowability and serving as a matrix, the conductive particles having a specific gravity greater than that of the matrix component.

In the present invention, the conductive particles having a specific gravity different from that of the nonconductive matrix component having fluidity or flowability and serving as a matrix, may be the sedimented particles having a specific gravity greater than that of the nonconductive matrix component. In the present invention, the sedimented particles (conductive particles) are mixed with a nonconductive elastomer having fluidity or flowability, and the nonconductive elastomer is cured.

Before the nonconductive elastomer cures, the sedimented particles (conductive particles) are sedimented, i.e., the sedimented particles (conductive particles) are unevenly dispersed to form conductive portions where the sedimented particles (conductive particles) are highly densely contained.

The curing time of the nonconductive elastomer having fluidity may be suitably adjusted or the size of the sedimented particles (size of the conductive particles) may be suitably adjusted to form the conductive portions such that the density of the sedimented particles (conductive particles) is the highest in the lowermost layer and that the density of the sedimented particles (conductive particles) decreases from the lowermost layer toward the upper layer.

In letting the sedimenting particles (conducting particles) to be sedimented in the nonconductive elastomer so that the nonconductive elastomer forms substantially nonconductive portions, the boundary between the conductive portion and the nonconductive portion can be more clarified by quickly forming the conductive portions. For this purpose, a mixture of the nonconductive elastomer having fluidity or flowability and the sedimented particles (conductive particles) may be shaken such that the rate of sedimentation of the sedimenting particles (conductive particles) may be enhanced.

The present invention may be further characterized in that the nonconductive sheet with the conductive portions is such that the conductive portions are formed highly densely containing the conductive particles that are unevenly dispersed due to the centrifugal force in the nonconductive elastomer having fluidity or flowability, the conductive particles having a specific gravity greater than that of the nonconductive elastomer.

To make more clearly divided a conductive portion and a nonconductive portion or to more quickly form the conductive portion, a centrifugal force may be applied to a mixture of the nonconductive elastomer having fluidity or flowability and the conductive particles having a specific gravity greater than that of the nonconductive elastomer to form conductive portions where the conductive particles are highly densely contained.

In obtaining anisotropic conductive pieces by utilizing a centrifugal force on the mixture of the nonconductive elastomer having fluidity before being cured and the conductive particles having a specific gravity greater than that of the nonconductive matrix component, the mixture is formed into a sheet, and the sheet-like mixture is introduced into a rotary molding machine and is subjected to the curing reaction while rotating the rotary molding machine. The sheet member after cured is cut into a predetermined length to obtain anisotropic conductive pieces.

The anisotropic conductive pieces in which the conductive particles are unevenly dispersed due to the sedimentation or the centrifugal force are sliced in the next step in a direction in which the conductive portions and the nonconductive portions are laminated. Thicknesses of the conductive portions and the nonconductive portions serve as a width of either the conductive regions or the nonconductive regions having rectangular areas penetrating from the front surface to the back surface of the anisotropic conductive sheet which is the final product.

In the anisotropic conductive sheet which is the final product, therefore, the thicknesses of the conductive portions and the nonconductive portions is set in advance so as to define a width of either the conductive regions or the nonconductive regions or to define a pitch between the conductive regions.

In the present invention, the electrically conductive portions are formed in the nonconductive elastomer having fluidity or flowability by unevenly dispersing the conductive particles by utilizing difference in the specific gravity. The nonconductive portions are forming a separation layer due to the uneven dispersion of the conductive particles. The thus obtained nonconductive sheet with conductive portions is cut in a direction in which the conductive particles are sedimented or in a direction in which the conductive particles are centrifugally separated in a manner to penetrate from the front surface to the back surface of the anisotropic conductive sheet in the cross section.

In this anisotropic sheet, the boundary between the conductive portion and the nonconductive portion may not be clearly defined as a separation layer in a direction in parallel with the plane of the anisotropic conductive sheet. That is, the conductive portion and the nonconductive portion as being separated layers are distinguished by density difference of the conductive particles in the direction in parallel with the surface of the anisotropic conductive sheet. Therefore, the difference in the electric resistance may be or may not be sharp at the boundary between the conductive portion and the nonconductive portion. Unlike the case when the conductive sheet and the nonconductive sheet are joined with a nonconductive material, however, the conductive member and the nonconductive member are not physically insulated at the boundary by exhibiting a distinct difference in the electric resistance.

However, it may be clear that the density of the conductive particles is uniform in the conductive portion in the direction of the thickness of the anisotropic conductive sheet of the present invention. Upon highly densely containing the conductive particles exhibiting a low resistivity such as silver particles in the nonconductive elastomer, it can be expected to obtain a thick anisotropic conductive sheet exhibiting a volume resistivity of about $10^{-5}$ $\Omega\cdot cm$ and having a thickness of not smaller than 1 mm.

Examples of the nonconductive elastomer having fluidity or flowability include a blended rubber before vulcanization and a thermoplastic elastomer after heating. The nonconductive elastomer having fluidity or flowability is mixed with the conductive particles and in which the conductive particles are unevenly dispersed to form the conductive portions. The nonconductive elastomer is then vulcanized or is cured by returning it to normal temperature to obtain anisotropic conductive pieces having elasticity.

As the conductive particles to be mixed into the nonconductive elastomer having fluidity, there are provided metal particles made of metals such as gold, silver, copper, nickel, tungsten, platinum, palladium or any other pure metal, SUS, phosphor bronze or beryllium copper. From the standpoint of obtaining a low electric resistance, it is desired to use gold particles or silver particles. The particle size of the conductive particles and the mixing ratio thereof may be suitably selected from the viscosity of the nonconductive elastomer having fluidity and the electric resistance that is desired. It is also allowable to use the conductive particles of a metal other than gold and silver, which are coated with gold or silver.

The thus obtained anisotropic conductive pieces are molded and are laminated in a plurality of numbers and are chemically bonded together in a manner that the conductive portions and the nonconductive portions are alternately arranged. For this purpose, a coupling agent may be applied among the sheet members so as to chemically bond them together. The coupling agent is the one for bonding these members and may be the one usually available in the market. Concrete examples may include coupling agents of the type of silane, aluminum and titanate. A silane coupling agent is favorably used.

A method of manufacturing an isotropic conductive sheet according to the present invention may comprise: a first step of unevenly arranging the conductive portions in a nonconductive elastomer having fluidity or flowability and serving as a matrix, the conductive portions highly densely containing the conductive particles having a specific gravity greater than that of the matrix component; a second step of unevenly dispersing the conductive particles in the nonconductive elastomer having fluidity and serving as the matrix so that nonconductive portions are substantially continuously joined thereto, and integrally curing the conductive portions and the noncondctive portions to mold isotropic conductive pieces; a third step of laminating a plurality of the anisotropic conductive pieces in a manner that the conductive portions and the nonconductive portions are alternately arranged thereby to obtain a first laminate; and a fourth step of cutting the first laminate obtained through the third step maintaining a predetermined thickness to obtain a zebra-like sheet.

To alternately laminate the conductive portions and the nonconductive portions means alternately laminating a plurality of anisotropic conductive pieces in any order. The nonconductive elastomer sheet may be laminated on the conductive portion at the final end such that the conductive portion is held between the nonconductive portions.

In the third step of laminating the plurality of anisotropic conductive pieces, the coupling agent may be applied among the anisotropic conductive pieces so that the sheet members are chemically bonded together. The first laminate obtained through the lamination may be heated to increase the bonding among the sheet members, to further cure the sheet members or for any other purpose.

In the fourth step, the first laminate obtained through the third step is cut (sliced) in a direction in which the conductive portions and the nonconductive portions are laminated to obtain a so-called zebra sheet (anisotropic conductive zebra sheet) in which the conductive portions and the nonconductive portions are alternately arranged in parallel.

Further, a method of manufacturing an anisotropic conductive sheet according to the present invention may further comprise: a fifth step of alternately laminating the zebra-like sheets obtained through the fourth step and the nonconductive elastomer sheets to obtain a second laminate; and a sixth step of cutting the second laminate obtained through the fifth step in a predetermined thickness.

To alternately laminate the zebra-like sheets obtained through the fourth step and the nonconductive elastomer sheets means that the zebra-like sheets and the nonconductive elastomer sheets are alternately laminated in any order, without excluding holding the nonconductive elastomer sheets having different thicknesses between the zebra-like sheets. This does not exclude, either, bonding an auxiliary nonconductive elastomer sheet to one side surface of the second laminate.

In the fifth step of laminating the zebra-like sheets and the nonconductive elastomer sheets, the coupling agent may be applied among the sheets in the same manner as described above so that the sheets are chemically bonded together. The second laminate obtained through the lamination may be heated to increase the bonding among the sheets, to further cure the sheet members or for any other purpose.

In the sixth step, the second laminate obtained through the fifth step is cut (sliced) in a direction in which the conductive portions and the nonconductive portions are laminated to obtain a so-called matrix sheet (anisotropic conductive matrix sheet) in which the conductive portions are arranged vertically and transversely in the nonconductive elastomer sheet.

The first laminate and the second laminate can be cut by using a blade such as a cemented carbide cutter or a ceramic cutter, by using a grindstone such as a fine cutter, by using a saw, or by using any other cutting device or cutting instrument (which may include non-contact-type cutting apparatus such as a laser cutter and the like).

A cutting fluid such as a cutting fluid may be used in the step of cutting to prevent overheating, to realize finely cut surfaces or for any other purpose. Or, the dry cutting may be utilized. Further, the subject (e.g., work) being cut may be moved alone or together with the cutting device or the cutting instrument. It should be understood that the cutting conditions are suitably selected depending upon the first laminate or the second laminate.

To cut maintaining a predetermined thickness means to obtain a sheet member having a predetermined thickness by cutting. The predetermined thickness is not limited to a uniform thickness but permits a change in the thickness depending upon the portions of the sheet member.

The anisotropic conductive sheet of the present invention includes anisotropic conductive pieces obtained by integrally curing the conductive portions in which there are unevenly dispersed the conductive particles having a specific gravity greater than that of the matrix component of the nonconductive elastomer having a fluidity or flowability and serving as a matrix and the nonconductive portions which are substantially continuously formed and in which the conductive particles are unevenly dispersed in the nonconductive elastomer.

The anisotropic conductive pieces include the conductive portions and the nonconductive portions that have uniform densities in a direction of the thickness, are suited for forming an anisotropic conductive sheet, and make it possible to obtain a so-called anisotropic conductive zebra sheet if the conductive portions are arranged in parallel. If the conductive portions are longitudinally and transversely arranged, on the other hand, there can be obtained a so-called anisotropic conductive matrix sheet. Therefore, the step of obtaining a conductive sheet, the step of obtaining a nonconductive sheet and the step of laminating the conductive sheet and the nonconductive sheet can now be combined into one step to manufacture an anisotropic conductive sheet maintaining a high productivity and to provide a manufacturing method therefor.

Further features of the present invention, its nature and various advantages will be more apparent from the accompanying drawings and the following description of the preferred embodiments.

DESCRIPTION OF THE PREFERRED EMBODIMENTS

Preferred embodiments of the present invention will be described below in reference to the drawings. However, the present invention is not limited to the embodiments, and various modifications and changes in design can be made without departing from the scope of the present invention.

The preferred embodiments of the present invention will now be described with reference to the drawings.

Figure 1:
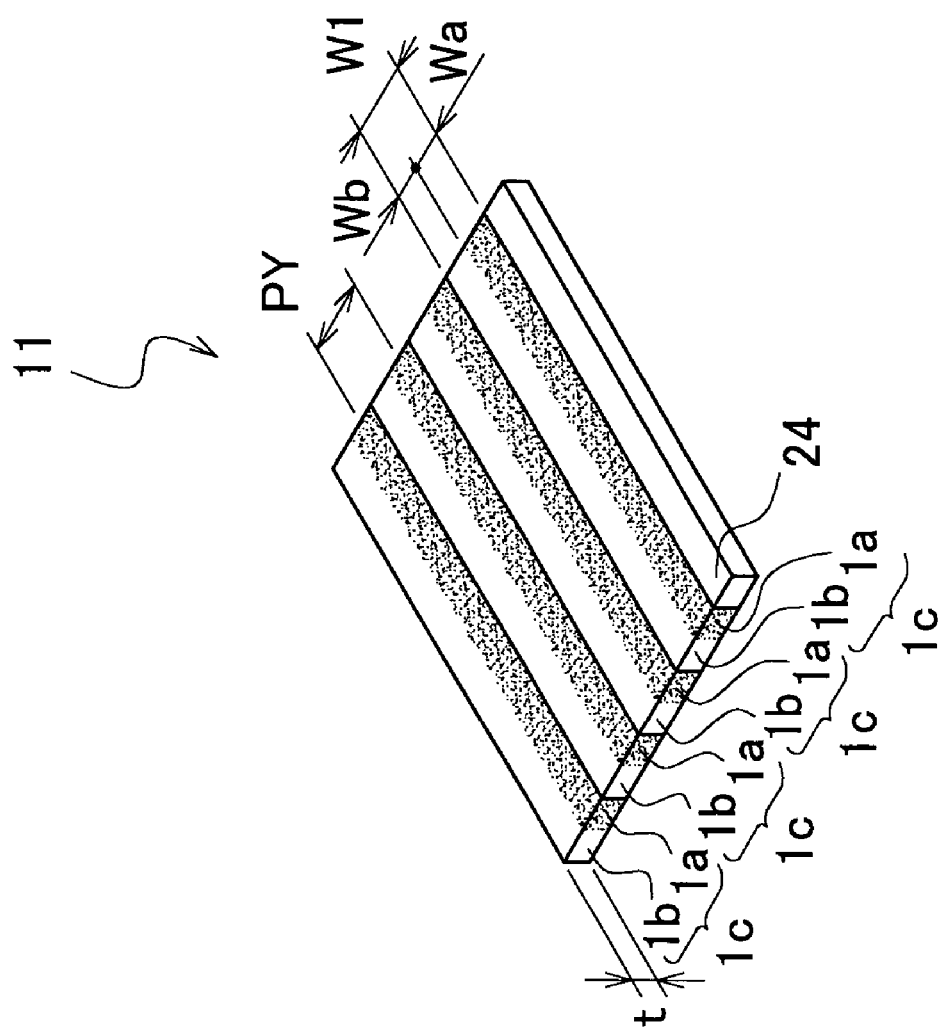
FIG. 1 is a perspective view illustrating the appearance of an anisotropic conductive sheet according to a first embodiment of the present invention.

FIG. 1 is a perspective view illustrating the appearance of an anisotropic conductive sheet according to a first embodiment of the present invention. In the first embodiment in FIG. 1, the anisotropic conductive sheet 11 is of a rectangular shape expanding like a plane and has conductivity in a direction of the thickness.

In the first embodiment in FIG. 1, a rectangular sheet member 1c includes a conductive portion 1a and a nonconductive portion integrally together, and forms an anisotropic conductive piece. The conductive portion 1a highly densely contains the conductive particles which are unevenly dispersed in a nonconductive elastomer having fluidity and serving as a matrix, the conductive particles having a specific gravity greater than that of the nonconductive matrix component. The nonconductive portion 1b is forming a substantially nonconductive portion since the conductive particles are unevenly dispersed in the nonconductive elastomer. Here, the conductive particles that are unevenly dispersed means that the conductive particles are unevenly dispersed in a direction of plane of the anisotropic conductive sheet 11 (direction nearly in parallel with the plane).

In the first form of the embodiment of FIG. 1, the sheet members 1c are arranged in line such that the conductive portions 1a and the nonconductive portions 1b are alternately arranged. A plurality of sheet members 1c are bonded together with a coupling agent. According to a method of manufacturing an anisotropic conductive sheet of the embodiment described later, a first laminate is obtained by laminating a plurality of anisotropic conductive pieces in a manner that the conductive portions 1a and the nonconductive portions 1b are alternately arranged, and the first laminate is cut maintaining a predetermined thickness to obtain a so-called anisotropic conductive zebra sheet.

In the form of the embodiment of FIG. 1, a short strip-like nonconductive elastomer sheet 24 is arranged along the conductive portion 1a at a final end such that the conductive portion 1a is held between the nonconductive portions 1b, and the sheet member 1c and the elastomer sheet 24 are chemically bonded together with a coupling agent.

The elastomer sheet 24 of the first embodiment of the present invention uses, as the nonconductive elastomer, a silicone rubber manufactured by Mitsubishi Jushi Co. or a silicone rubber manufactured by Shin-etsu Polymer Co., and the coupling agent is a silane coupling agent manufactured by Shin-etsu Polymer Co.

Referring to FIG. 1, the anisotropic conductive sheet 11 includes the conductive portions 1a arranged in a zebra form. The conductive portions 1a are forming through regions penetrating from the front surface to the back surface of the anisotropic conductive sheet 11. The sheet member 1c is forming the conductive portion 1a by mixing the conductive particles into the nonconductive matrix having fluidity in a manner that the conductive particles are unevenly dispersed by utilizing a difference in the specific gravity. The nonconductive portion 1b, on the other hand, is a separation layer formed by the unevenly dispersed conductive particles. The thus obtained anisotropic conductive piece is cut in a direction in which the conductive particles are sedimented or in a direction of centrifugal separation, such that the cut surfaces of the conductive portions 1a and the nonconductive portions 1b are exposed on the surfaces penetrating from the front surface to the back surface of the anisotropic conductive sheet 11.

In the anisotropic conductive sheet 11 that is a zebra sheet shown in FIG. 1, the conductive portions 1a contain the conductive particles at a uniform density in the direction of the thickness thereof. Upon highly densely containing the conductive particles exhibiting a low resistivity, such as silver particles in the nonconductive elastomer, it can be expected to obtain a thick anisotropic conductive sheet (anisotropic conductive zebra sheet) having conductivity of a very low volume resistivity with a thickness of not smaller than 1 mm.

In FIG. 1, the plurality of sheet members 1c and the short strip-like elastomer sheet 24 have the same thickness "t" in the embodiment. Therefore, the anisotropic conductive sheet 11 has the thickness "t".

As described above, the two neighboring short strip-like members are bonded together with the coupling agent. The plurality of sheet members 1c which are arranged in line in a manner that the conductive portions 1a and the nonconductive portions 1b are alternately arranged, too, are coupled together with the coupling agent to constitute a piece of zebra sheet shown in FIG. 1. Here, the coupling agent that is accomplishing the bonding is nonconductive and maintains nonconductive state in the direction of plane of the sheet.

The sheet member 1c has a width on one side (longitudinal width) of W1. The conductive portion 1a and the nonconductive portion 1b constituting the sheet member 1c have widths on one side (longitudinal widths) of Wa and Wb. The plurality of sheet members 1c have widths W1, Wa and Wb which are all the same in this embodiment, which, however, may be different in other embodiments. In the method of manufacturing the anisotropic conductive sheet of the embodiment that will be described later, the widths W1, Wa and Wb can be easily adjusted.

In the first embodiment of the present invention, further, the width on one side (longitudinal width) of the short strip-like elastomer sheet 24 is the same as the width on one side (longitudinal width) Wb of the nonconductive portion 1b of the sheet member 1c, and the width on the other side (transverse width) of the elastomer sheet 24 is the same as the width of the other side (transverse width) of the sheet member 1c.

Figure 2:
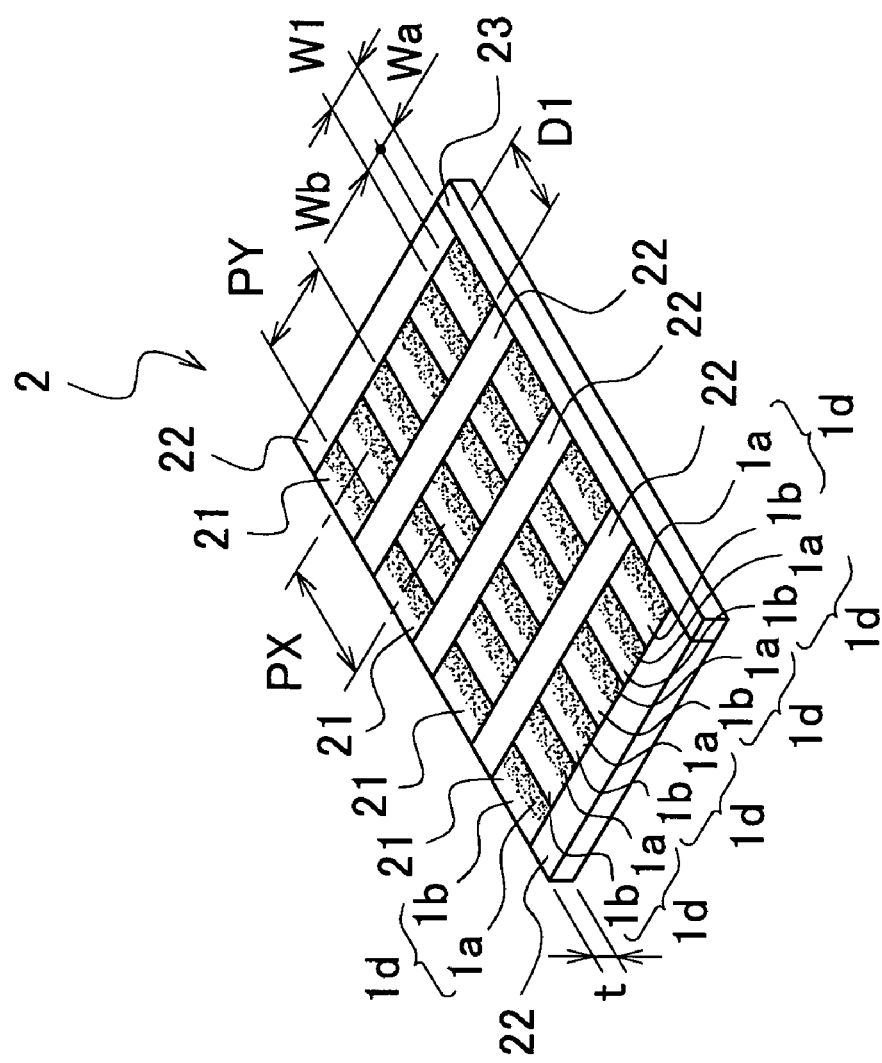
FIG. 2 is a perspective view illustrating the appearance of an anisotropic conductive sheet according to a second embodiment of the present invention.

Being constituted as described above, the anisotropic conductive sheet 11 of the embodiment of FIG. 1 has its both wings surrounded by the nonconductive elastomer. The anisotropic conductive sheet 11 of the embodiment of FIG. 1 is a so-called zebra sheet in which the conductive portions 1a are arranged on an XY-coordinate maintaining a gap PY FIG. 2 is a perspective view illustrating the appearance of an anisotropic conductive sheet according to a second form of the embodiment of the present invention. In the embodiment of FIG. 2, the anisotropic conductive sheet 2 is of a rectangular shape expanding on a plane and has conductivity in the direction of the thickness.

In the second form of the embodiment of FIG. 2, a rectangular sheet member 1d includes a conductive portion 1a and a nonconductive portion integrally together, and forms an anisotropic conductive piece. The conductive portion 1a highly densely contains the conductive particles which are unevenly dispersed in a nonconductive elastomer having fluidity and serving as a matrix, the conductive particles having a specific gravity greater than that of the nonconductive matrix component. The nonconductive portion 1b is forming a substantially nonconductive portion since the conductive particles are unevenly dispersed in the nonconductive elastomer. Here, the conductive particles that are unevenly dispersed means that the conductive particles are unevenly dispersed in a plane direction of the anisotropic conductive sheet 2 (direction nearly in parallel with the plane).

In the embodiment of FIG. 2, the sheet members 1d are arranged in line such that the conductive portions 1a and the nonconductive portions 1b are alternately arranged. A plurality of sheet members 1d are bonded together with the coupling agent to constitute a short strip-like zebra sheet 21.

According to a method of manufacturing an anisotropic conductive sheet of the embodiment described later, the zebra-like sheet 21 is obtained by laminating a plurality of sheet members 1d that form an anisotropic conductive piece in a manner that the conductive portions 1a and the nonconductive portions 1b are alternately arranged to thereby obtain a first laminate. The first laminate is cut maintaining a predetermined thickness to obtain the zebra-like sheet. The zebra-like sheets and the nonconductive elastomer sheets are alternately laminated and bonded together to obtain a second laminate which is, then, cut maintaining a predetermined thickness to obtain a so-called anisotropic conductive matrix sheet.

In the embodiment of FIG. 2, short strip-like nonconductive elastomer sheets 22 are arranged among the zebra-like sheets 21, the zebra-like sheets 21 and the elastomer sheets 22 being bonded together with the coupling agent. Referring to FIG. 2, further, the short strip-like nonconductive elastomer sheets 22 are arranged for the zebra-like sheets 21 at both ends. Besides, auxiliary nonconductive elastomer sheets 23 are arranged to cover the conductive portion 1a at an edge. The elastomer sheets 22 and 23, too, are bonded together with the coupling agent.

The anisotropic conductive sheet of the second embodiment of the present invention uses, as the nonconductive elastomer, a silicone rubber manufactured by Mitsubishi Jushi Co. or a silicone rubber manufactured by Shin-etsu Polymer Co., and the coupling agent is a silane coupling agent manufactured by Shin-etsu Polymer Co.

Referring to FIG. 2, the anisotropic conductive sheet 2 includes the conductive portions 1a arranged like a matrix. The conductive portions 1a are forming through regions penetrating from the front surface to the back surface of the anisotropic conductive sheet 2. The sheet member 1d is forming the conductive portion 1a by mixing the conductive particles into the nonconductive matrix having fluidity in a manner that the conductive particles are unevenly dispersed by utilizing a difference in the specific gravity. The nonconductive portion 1b, on the other hand, is a separation layer formed by the unevenly dispersed conductive particles. The thus obtained anisotropic conductive piece is cut in a direction in which the conductive particles are sedimented or in a direction of centrifugal separation, such that the cut surfaces of the conductive portions 1a and the nonconductive portions 1b are exposed on the surfaces penetrating from the front surface to the back surface of the anisotropic conductive sheet 2.

In the anisotropic conductive sheet 2 that is shown in FIG. 2, the conductive portions 1a contain the conductive particles at a uniform density in the direction of the thickness thereof. Upon highly densely containing the conductive particles exhibiting a low resistivity, such as silver particles in the nonconductive elastomer, it can be expected to obtain a thick anisotropic conductive sheet (anisotropic conductive matrix sheet) having conductivity of a very low volume resistivity with a thickness of not smaller than 1 mm.

In FIG. 2, the short strip-like zebra sheet 21, the short strip-like elastomer sheet 22 and the short strip-like elastomer sheet 23 have the same thickness "t" in the embodiment. Therefore, the anisotropic conductive sheet 2 has the thickness "t".

As described above, the two neighboring short strip-like members are bonded together with the coupling agent. The plurality of sheet members 1d which are arranged in line in a manner that the conductive portions 1a and the nonconductive portions 1b are alternately arranged, too, are coupled together with the coupling agent to constitute a piece of matrix sheet shown in FIG. 2. Here, the coupling agent that is accomplishing the bonding is nonconductive and maintains nonconductive state in the direction of plane of the sheet.

The sheet member 1d has a width on one side (longitudinal width) of W1 and has a width on the other side (transverse width) of D1. The conductive portion 1a and the nonconductive portion 1b constituting the sheet member 1d have widths on one side (longitudinal widths) of Wa and Wb. The plurality of sheet members 1d have widths W1, D1, Wa and Wb which are all the same in this embodiment, which, however, may be different in other embodiments. In the method of manufacturing the anisotropic conductive sheet of the embodiment that will be described later, the widths W1, D1, Wa and Wb can be easily adjusted.

In this embodiment, further, the widths on one side (longitudinal widths) of the elastomer sheets 22 are the same as the widths on one side (longitudinal widths) of the zebra-like sheets 21, and the widths on the other side (transverse widths) of the elastomer sheets 22 are all the same. Further, the width on one side (longitudinal width) of the elastomer sheet 23 is the same as the width on one side (longitudinal width) Wb of the nonconductive portion 1b, and the width on the other side (transverse width) of the elastomer sheet 23 is the same as the width on the other side (transverse width) of the anisotropic conductive sheet 2.

Being constituted as described above, the anisotropic conductive sheet 2 of the embodiment of FIG. 2 has peripheral sides surrounded by the nonconductive elastomer. The anisotropic conductive sheet 2 of the embodiment of FIG. 2 is a so-called matrix sheet in which the conductive portions 1a are arranged on an XY-coordinate maintaining gaps PX and PY.

Next, described below is the method of manufacturing the anisotropic conductive sheet of the above embodiments. First, the anisotropic conductive piece obtained through the first step and the second step will be described with reference to a perspective view of FIG. 3.

Figure 3:
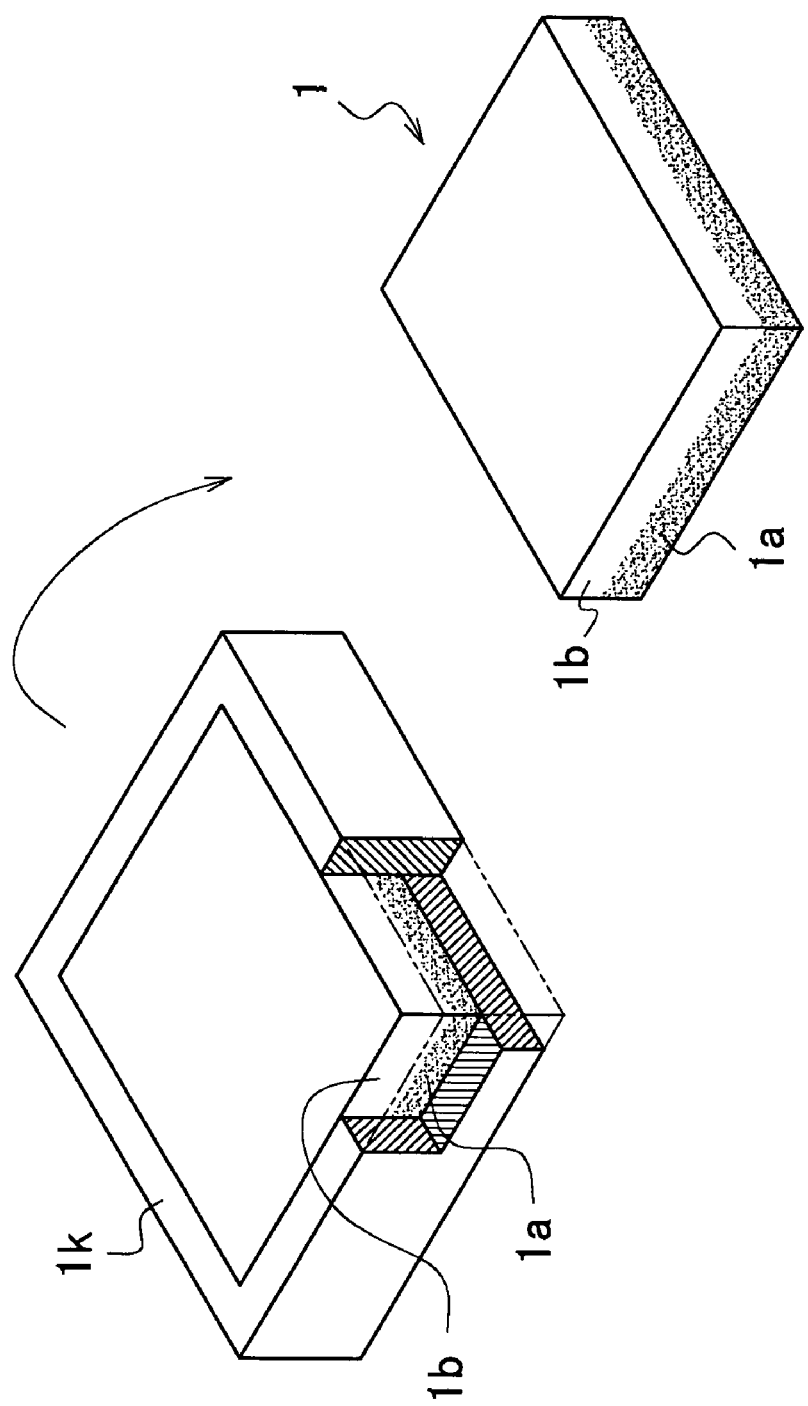
FIG. 3 is a perspective view of an anisotropic conductive piece obtained through a first step and a second step related to a method of manufacturing the anisotropic conductive sheet of the embodiment of the present invention.

In the embodiment of FIG. 3, there is provided a metal mold 1k having a recessed portion of a thin rectangular parallelopiped shape. A mixture of the liquid silicone rubber, the conductive particles (e.g., silver particles) and the curing agent, is poured into the metal mold 1k. It is important that the mixture contains the conductive particles having a specific gravity greater than that of the liquid silicone rubber that serves as a matrix. As required, further, the mixture may be added with a reinforcing agent and a sticking agent.

In the mixture poured into the metal mold 1k, there are sedimented, after the passage of a given period of time, the conductive particles having a specific gravity greater than that of the liquid silicone rubber that serves as the matrix, and the conductive portion 1a highly densely containing the conductive particles is formed in the lower layer of the mixture. As the conductive particles are sedimented causing the conductive portion 1a to be unevenly arranged in the lower layer of the mixture, the upper layer of the mixture forms the nonconductive portion 1b without substantially containing the conductive particles.

It is desired that the conductive portions highly densely containing the conductive particles are formed before the mixture is cured, and it is recommended to find the curing time of the mixture and the sedimentation time of the conductive particles in advance through experiment.

In the first step of forming the conductive portion 1a highly densely containing the conductive particles by the sedimentation of the conductive particles in the mixture, the metal mold 1k into which the mixture is poured may be positively vibrated to quicken the rate of sedimentation of the conductive particles to quickly form the conductive portion 1a and to further clarify the boundary between the conductive portion 1a and the nonconductive portion 1b.

In the first step, further, a centrifugal force may be acted on the mixture of the nonconductive elastomer having fluidity and the conductive particles having a specific gravity greater than that of the nonconductive elastomer to quickly form the conductive portion 1a highly densely containing the conductive particles and to further clarify the boundary between the conductive portion 1a and the nonconductive portion 1b.

It may be so considered that the thus obtained conductive portion 1a has a depth of deposition that corresponds to the width on one side (longitudinal width) Wa of the conductive portion 1a shown in FIG. 1, and the thickness of the layer of the nonconductive portion 1b obtained through the step shown in FIG. 3 corresponds to the width on one side (longitudinal width) Wb of the nonconductive portion 1b shown in FIG. 1.

The above liquid silicone rubber may be a room temperature-curing silicone rubber or a thermosetting silicone rubber. Though the room temperature-curing silicone rubber requires a curing time longer than that required by the thermosetting silicone rubber, either one of them is suitably selected from the viewpoint of a relationship to the rate of sedimentation of the conductive particles. When the thermosetting silicone rubber is used, the mixture is heated together with the metal mold 1k.

Instead of the liquid silicone rubber, the blended rubber before being vulcanized may be mixed with the conductive particles and may be cured by vulcanization after the conductive particles have been sedimented.

After the second step of molding the anisotropic conductive piece 1 by curing the conductive portion 1a and the nonconductive portion 1b integrally together, the anisotropic conductive piece 1 is taken out from the metal mold 1k and is transferred to a next step. The anisotropic conductive piece 1 taken out from the metal mold 1k may be polished on its front and back surfaces before being transferred to the next step.

Figure 4:
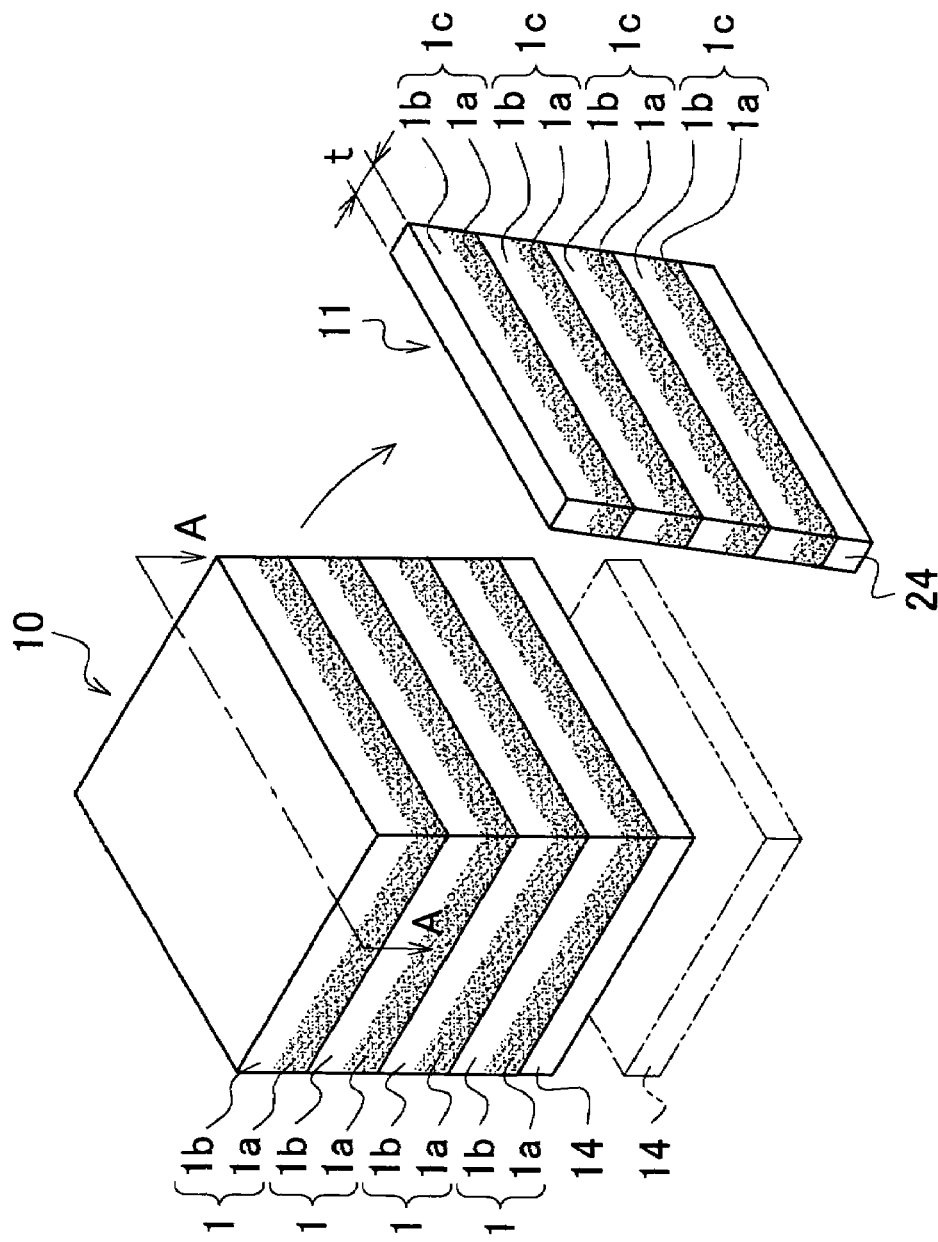
FIG. 4 is a perspective view illustrating a third step of laminating a plurality of anisotropic conductive pieces obtained through the second step and a fourth step of cutting the laminate in a predetermined thickness in the method of manufacturing the anisotropic conductive sheet according to a first embodiment of the present invention.

FIG. 4 is a perspective view illustrating a third step of laminating a plurality of anisotropic conductive pieces 1 obtained through the second step and a fourth step of cutting the laminate maintaining a predetermined thickness.

In the first embodiment of FIG. 4, a plurality of anisotropic conductive pieces 1 are laminated in a manner that the conductive portions 1a and the nonconductive portions 1b are alternately arranged. There is further provided in advance a nonconductive elastomer sheet 14, and the anisotropic conductive pieces 1 are so laminated that the conductive portion 1a of the final end comes in contact with the elastomer sheet 14.

The coupling agent is applied among a plurality of anisotropic conductive pieces 1 and between the anisotropic conductive piece 1 and the elastomer sheet 14, whereby the plurality of anisotropic conductive pieces and the elastomer sheet 14 are bonded together to form a first laminate 10.

At a next fourth step, the first laminate 10 obtained through the third step is cut maintaining a predetermined thickness t along the A-A direction in which the plurality of anisotropic conductive pieces 1 are laminated. As the first laminate 10 is cut at the fourth step, there is obtained the anisotropic conductive sheet 11 shown in FIG. 1 in which there are arranged, in a zebra form, sheet members 1c having a thickness t and each comprising a set of the conducive portion 1a and the nonconductive portion 1b.

Figure 5:
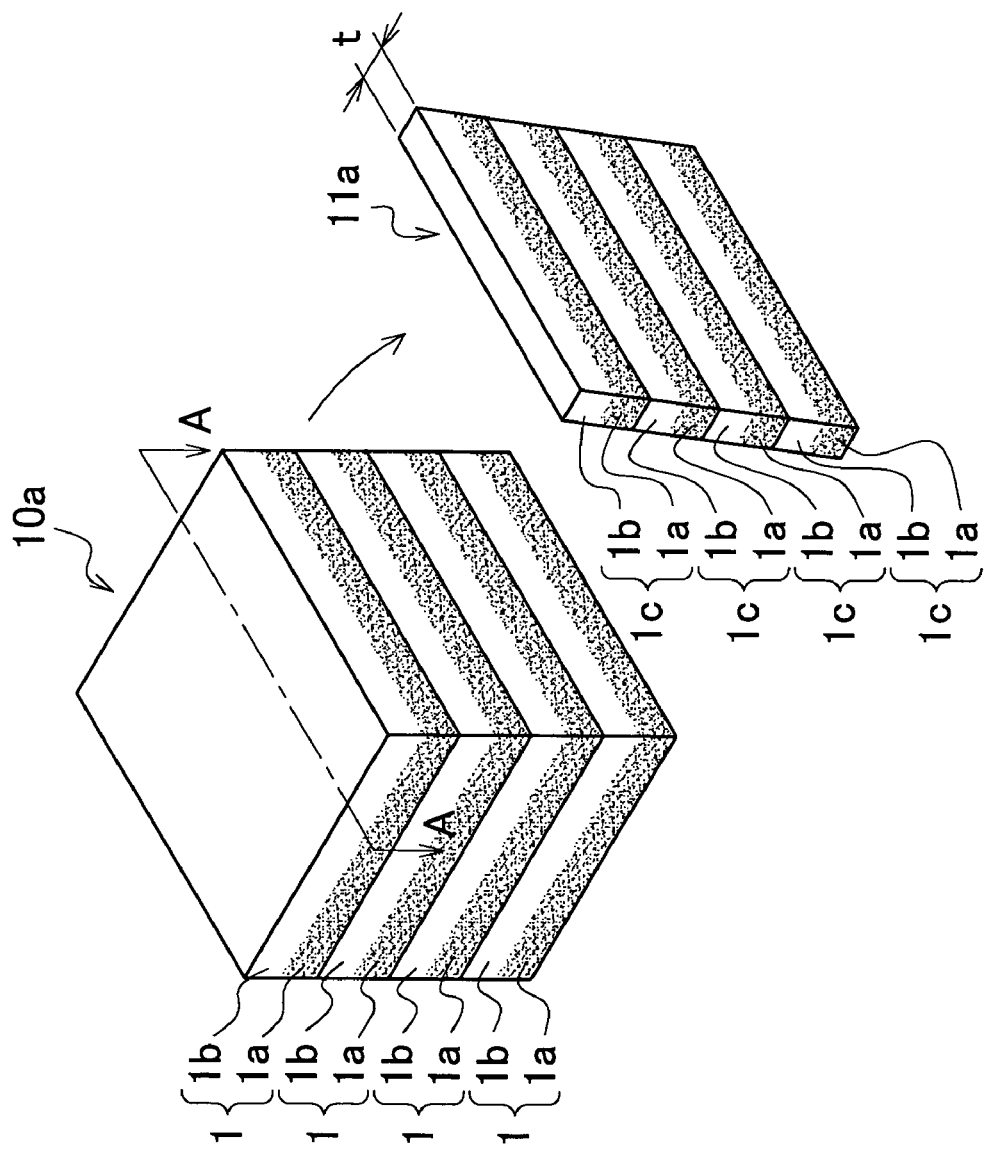
FIG. 5 is a perspective view illustrating the third step of laminating a plurality of anisotropic conductive pieces obtained through the second step and the fourth step of cutting the laminate in a predetermined thickness in the method of manufacturing the anisotropic conductive sheet according to a second embodiment of the present invention.

FIG. 5 is a perspective view illustrating the third step of laminating a plurality of anisotropic conductive pieces 1 obtained through the second step and the fourth step of cutting the laminate maintaining a predetermined thickness.

In the second embodiment of FIG. 5, a plurality of anisotropic conductive pieces 1 are laminated in a manner that the conductive portions 1a and the nonconductive portions 1b are alternately arranged. The coupling agent is applied to the anisotropic conductive pieces 1, so that the plurality of anisotropic conductive pieces 1 are bonded together to form a first laminate 10a.

At a next fourth step, the first laminate 10a obtained through the third step is cut maintaining a predetermined thickness t along the A-A direction in which the plurality of anisotropic conductive pieces 1 are laminated. As the first laminate 10a is cut at the fourth step, there is obtained a zebra-like sheet 11a in which there are laminated a plurality of layers of sheet members 1c having a thickness t and each comprising a set of the conducive portion 1a and the nonconductive portion 1b. It may be so considered that the thus obtained zebra-like sheet 11a has the thickness t that corresponds to the width of the other side (transverse width) D1 of the zebra-like sheet 21 shown in FIG. 2.

Figure 6:
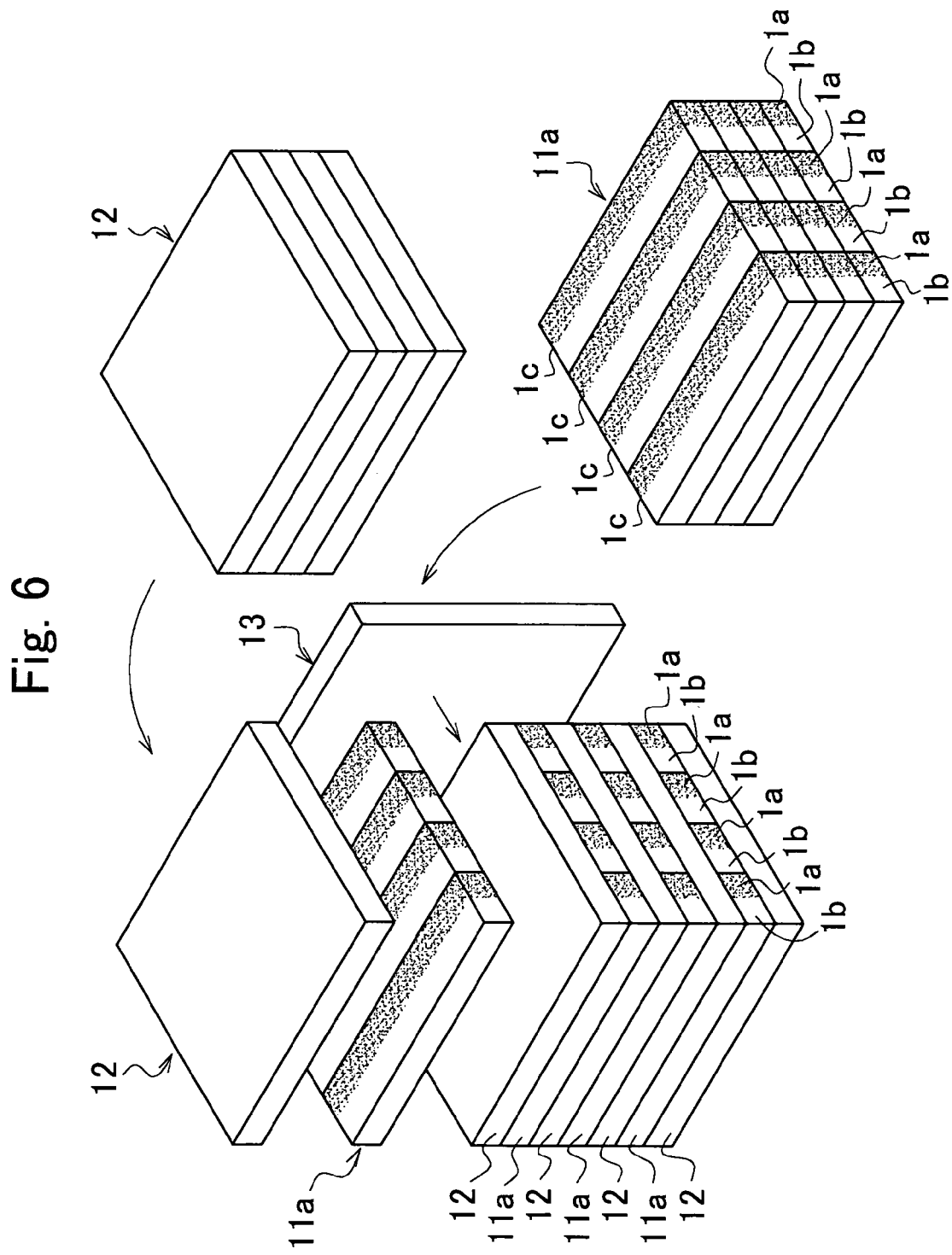
FIG. 6 is a perspective view illustrating a fifth step of alternately laminating zebra-like sheets obtained through the fourth step and nonconductive elastomer sheets prepared in advance in the method of manufacturing the anisotropic conductive sheet according to the second embodiment of the present invention.

FIG. 6 is a perspective view illustrating a fifth step of alternately laminating the zebra-like sheets 11a obtained through the fourth step and the nonconductive elastomer sheets 12 that have been prepared in advance. In the second form of the embodiment of FIG. 6, the zebra-like sheets 11a are further laminated on a second laminate 20 (see FIG. 7 described below) that is on the way of being laminated, and nonconductive elastomer sheets 12 are laminated thereon.

The coupling agent is applied among the zebra-like sheets 11a and the elastomer sheets 12, and the plurality of zebra-like sheets 11a and the plurality of elastomer sheets 12 are bonded together. In the embodiment of FIG. 6, a nonconductive elastomer sheet 13 is further provided, and is bonded with the coupling agent to the side surface of the second laminate 20 (see FIG. 7 described below) formed by alternately laminating the zebra-like sheets 11a and the elastomer sheets 12.

It may be so considered that the thickness of the alternate laminate of the zebra-like sheets 11a and the elastomer sheets 12 correspond to the width of the other side (transverse width) of the anisotropic conductive sheet 2 of FIG. 2 and that the thickness thereof inclusive of the elastomer sheet 13 corresponds to the width of one side (longitudinal width) of the anisotropic conductive sheet 2 of FIG. 2.

Figure 7:
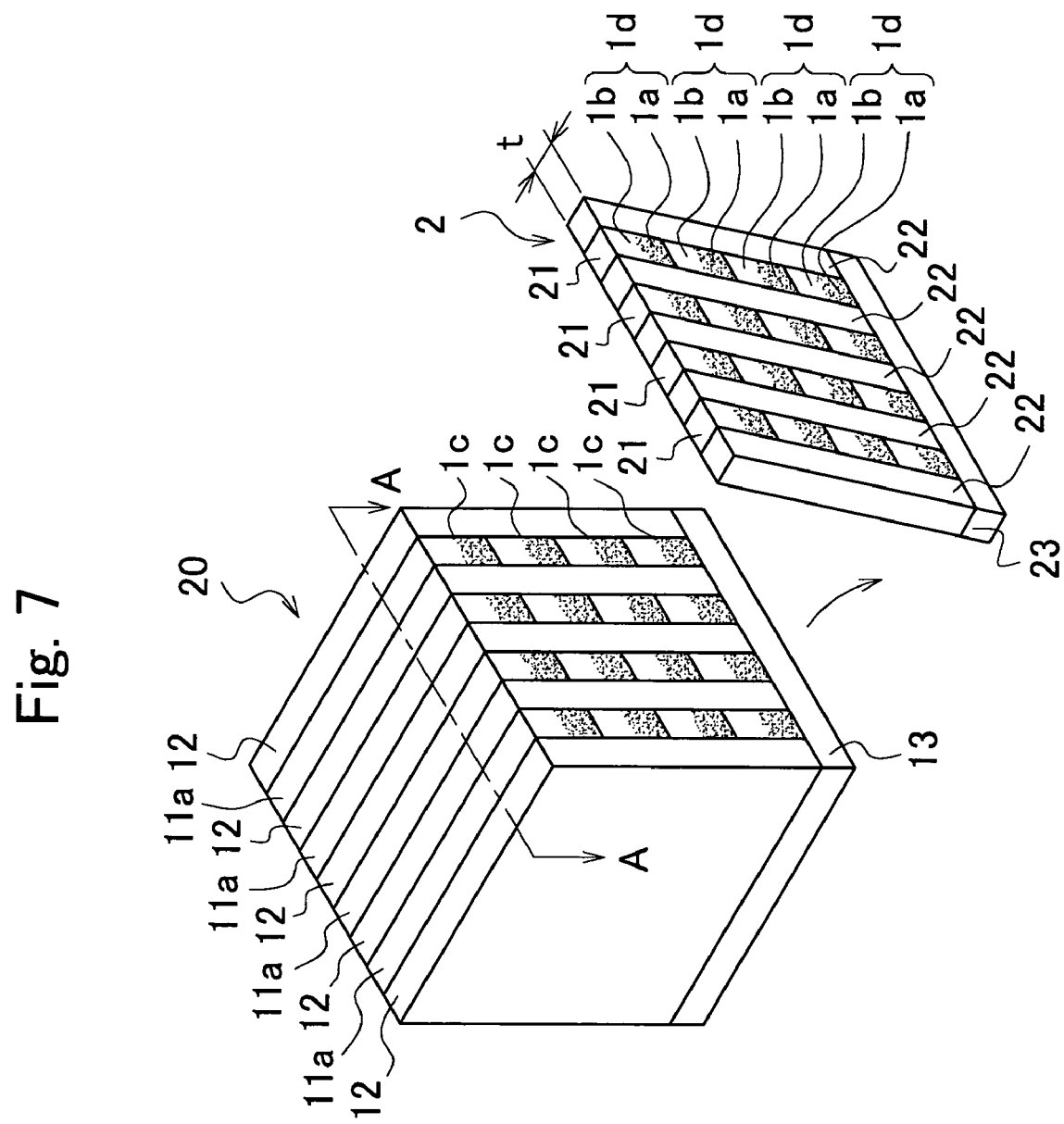
FIG. 7 is a perspective view illustrating a sixth step of cutting a second laminate obtained through the fifth step maintaining a predetermined thickness in the method of manufacturing the anisotropic conductive sheet according to the second embodiment of the present invention.

FIG. 7 is a perspective view illustrating a sixth step of cutting the second laminate 20 obtained through the fifth step maintaining a predetermined thickness. In the embodiment of FIG. 7, the second laminate 20 obtained through the fifth step is cut maintaining a predetermined thickness t along the A-A direction in which the plurality of zebra-like sheets 11a and the elastomer sheets 12 are laminated. As the second laminate 20 is cut at the sixth step, there is obtained the anisotropic conductive sheet 2 in which there are laminated a plurality of rectangular sheet members 1d having the thickness t and each of which being formed by the conductive portion 1a and the nonconductive portion 1b integrally together. The anisotropic conductive sheet 2 shown in FIG. 7 is a so-called matrix sheet in which the conductive portions 1a are arranged longitudinally and transversely in the nonconductive sheet.

At a sixth step shown in FIG. 7, the conductive portions 1a contain the conductive particles at a uniform density in the direction of the thickness thereof. Upon highly densely containing the conductive particles exhibiting a low resistivity, such as silver particles in the nonconductive elastomer having fluidity of before being cured, it can be expected to obtain a thick anisotropic conductive sheet (anisotropic conductive matrix sheet) having conductivity of a low volume resistivity of about $10^{-5}$ Ω·cm with a thickness of not smaller than 1 mm.

Figure 8:
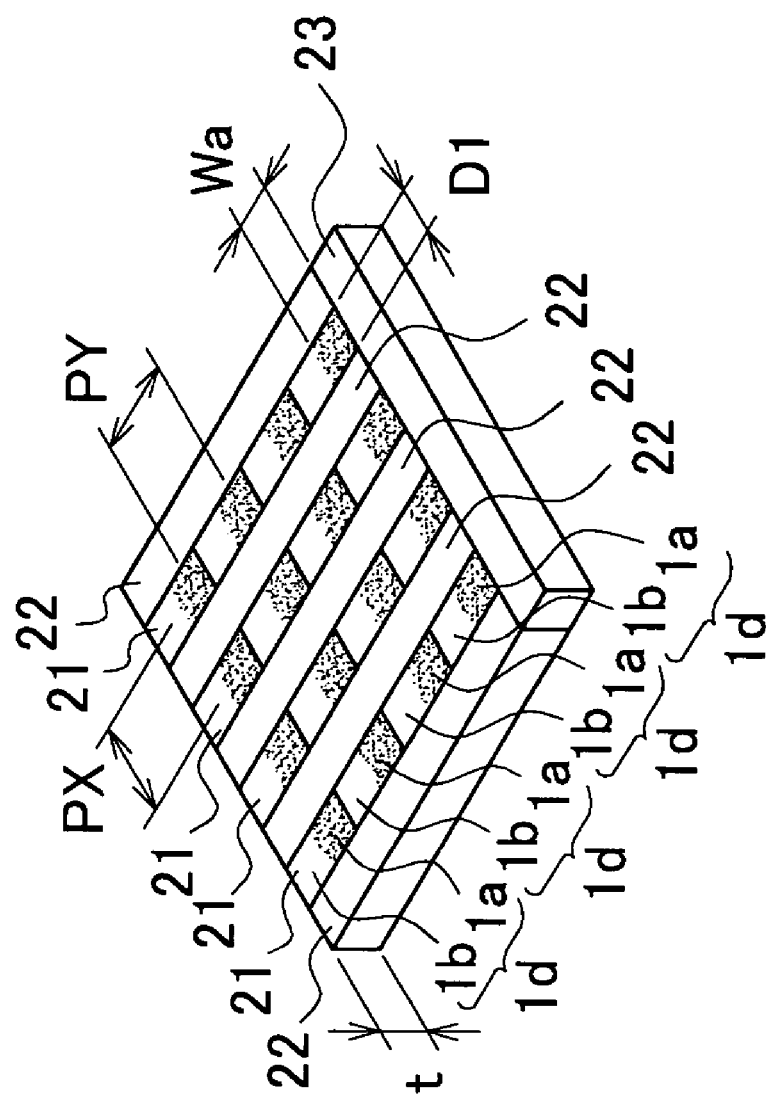
FIG. 8 is a perspective view of an anisotropic conductive sheet obtained with a method of manufacturing an anisotropic conductive sheet according to the second embodiment of the present invention.

FIG. 8 is a perspective view of an anisotropic conductive sheet 2 obtained by a method of manufacturing an anisotropic conductive sheet according to an embodiment of the present invention. The anisotropic conductive sheet 2 shown in FIG. 8 has the same constitution and the same structure as those of the anisotropic conductive sheet 2 shown in FIG. 2. In the anisotropic conductive sheet 2 shown in FIG. 8, the conductive portions 1a have a square shape, and have a transverse pitch PY and a longitudinal pitch PX which are the same. In the anisotropic conductive sheet 2 shown in FIG. 2, on the other hand, the conductive portions 1a are of a longitudinally elongated rectangular shape, and have a transverse pitch PY and a longitudinal pitch PX which are different from each other.

The anisotropic conductive sheet 11 shown in FIG. 1 and the anisotropic conductive sheet 2 having longitudinally elongated conductive portions 1a shown in FIG. 2 can be used as for connecting ICs that have edge connectors or linearly arranged leads.

On the other hand, the anisotropic conductive sheet 2 having conductive portions 1a arranged maintaining the transverse pitch PY and the longitudinal pitch PX which are the same shown in FIG. 8, can be used as a connector for connecting the terminals of the printed boards having lands arranged like a matrix and of the BGA (ball grid array) type packaged ICs.

What is claimed is:

1. An anisotropic conductive sheet comprising:
    a predetermined thickness;
    a sheet surface expanding in a plane; and
    a plurality of anisotropic conductive pieces having a substantially same predetermined thickness and being conductive in a direction of the thickness,
    wherein the plurality of anisotropic conductive pieces are bonded together directly or indirectly with respective thicknesses thereof aligned to form the plane;
    wherein each of the anisotropic conductive pieces has an electric conductance in the direction of the thickness, which varies substantially continuously in a predetermined direction on the sheet surface; and
    wherein regions having higher electric conductances in the direction of the thickness are provided in a discontinuous manner on the sheet surface of the anisotropic conductive sheet.

2. The anisotropic conductive sheet according to claim 1, wherein each anisotropic conductive piece comprises a nonconductive elastomer and conductive particles, the nonconductive elastomer constitutes a matrix, and the conductive particles are dispersed in the matrix; and
    wherein the nonconductive elastomer is formed by making a flowable base component non-flowable or solidified; and
    wherein the conductive particles have a specific gravity greater than that of the flowable base component.

3. The anisotropic conductive sheet according to claim 1, further comprising:
    nonconductive pieces being composed of a nonconductive elastomer,
    wherein the nonconductive pieces have a predetermined thickness substantially same as the thickness of the anisotropic conductive sheet, and
    wherein at least one of the anisotropic conductive pieces and at least one of the nonconductive pieces are bonded to each other.

4. The anisotropic conductive sheet according to claim 2, further comprising:
    nonconductive pieces being composed of a nonconductive elastomer,
    wherein the nonconductive pieces have a predetermined thickness substantially same as the thickness of the anisotropic conductive sheet, and
    wherein at least one of the anisotropic conductive pieces and at least one of the nonconductive pieces are bonded to each other.

5. The anisotropic conductive sheet according to claim 1, wherein at least one of the an isotropic conductive pieces has an electric conductance in the direction of the thickness, the electric conductance continuously varying from a substantially nonconductive state to a good conductive state in a predetermined direction on the sheet surface.

6. The anisotropic conductive sheet according to claim 2, wherein at least one of the anisotropic conductive pieces has an electric conductance in the direction of the thickness, the electric conductance continuously varying from a substantially nonconductive state to a good conductive state in a predetermined direction on the sheet surface.

7. The anisotropic conductive sheet according to claim 3, wherein at least one of the anisotropic conductive pieces has an electric conductance in the direction of the thickness, the electric conductance continuously varying from a substantially nonconductive state to a good conductive state in a predetermined direction on the sheet surface.

8. The anisotropic conductive sheet according to claim 4, wherein at least one of the anisotropic conductive pieces has an electric conductance in the direction of the thickness, the electric conductance continuously varying from a substantially nonconductive state to a good conductive state in a predetermined direction on the sheet surface.

9. The anisotropic conductive sheet according to claim 2, wherein each anisotropic conductive piece has a continuously varying electric conductance by utilizing sedimentation of the conductive particles in the flowable base component.

10. The anisotropic conductive sheet according to claim 4, wherein anisotropic conductive piece has a continuously varying electric conductance by utilizing sedimentation of the conductive particles in the flowable base component.

11. The anisotropic conductive sheet according to claim 6, wherein each anisotropic conductive piece has a continuously varying electric conductance by utilizing sedimentation of the conductive particles in the flowable base component.

12. The anisotropic conductive sheet according to claim 8, wherein each anisotropic conductive piece has a continuously varying electric conductance by utilizing sedimentation of the conductive particles in the flowable base component.

13. A method of manufacturing an anisotropic conductive sheet comprising: a sheet surface expanding in a plane and regions on the sheet surface having good conductivity in a direction of a thickness under a predetermined condition, the method comprising the steps of:
    preparing a plurality of gradient conductive sheets having a predetermined thickness, each including a portion having an electric conductance which substantially continuously varies from a substantially nonconductive state to a good conductive state in the direction of the thickness;
    laminating the plurality of gradient conductive sheets and curing the laminated sheets to form a lump of laminated gradient conductive sheets; and
    cutting the lump of laminated gradient conductive sheets in a predetermined thickness to form zebra-like sheets;
    wherein, in preparing the plurality of gradient conductive sheets, to make a flowable base component non-flowable or solidified, a density profile of conductive particles dispersed in the flowable base component is arranged to continuously vary in a direction of the thickness by sedimentation of the conductive particles, the conductive particles having a specific gravity greater than that of the flowable base component.

14. The method according to claim 13, further comprising the steps of:

laminating the zebra-like sheets and nonconductive sheets composed of nonconductive elastomers in an alternate manner to form a lump of laminated sheets, and curing the lump of alternate sheets to form a lump of laminated zebra-like-and-nonconductive sheets;

cutting the lump of laminated zebra-like-and-nonconductive sheets in a predetermined thickness to form an anisotropic conductive sheet such that at least one region has a good electric conductance in the direction of the thickness.

15. An anisotropic conductive sheet comprising:

a plurality of anisotropic conductive pieces having a substantially same predetermined thickness, each having continuous first and second portions, the first portion having a higher electric conductance and the second portion having a lower electric conductance in a direction of the thickness, wherein electric conductances substantially continuously vary from the first portion to the second portion, wherein the plurality of anisotropic conductive pieces are bonded together in a form of a sheet, and wherein neighboring anisotropic conductive pieces are bonded together such that a first portion of a piece and a second portion of the other piece are adjacent to each other.

16. The anisotropic conductive sheet according to claim 15, wherein each anisotropic conductive piece comprises a nonconductive elastomer and conductive particles, the nonconductive elastomer constitutes a matrix, and the conductive particles are dispersed in the matrix;

wherein the nonconductive elastomer includes one of a non-flowable state and a solidified state of a flowable base component; and wherein the conductive particles have a specific gravity greater than that of the flowable base component.

17. The anisotropic conductive sheet according to claim 15, further comprising nonconductive pieces being composed of a nonconductive elastomer, wherein the nonconductive pieces have a predetermined thickness substantially same as the thickness of the anisotropic conductive sheet, and wherein the anisotropic conductive pieces and the nonconductive pieces are bonded to each other.

18. The anisotropic conductive sheet according to claim 15, wherein the first portion is electrically conductive and the second portion is substantially electrically nonconductive.

19. The anisotropic conductive sheet according to claim 15, wherein each anisotropic conductive piece has a continuously varying electric conductance by utilizing sedimentation of the conductive particles in the flowable base component.

20. A method of manufacturing an anisotropic conductive sheet comprising the steps of:

preparing a plurality of conductive sheets having a predetermined thickness, each having electric conductances which continuously vary in a direction of the thickness; laminating the plurality of conductive sheets; curing the laminated sheets to form a lump of conductive sheets; and cutting the lump in a predetermined thickness to form zebra-like sheets, wherein when a flowable base component is caused to be non-flowable or solidified during the step of preparing the plurality of conductive sheets, a density profile of conductive particles dispersed in the flowable base component is arranged to continuously vary in a direction of the thickness by sedimentation of the conductive particles which have a specific gravity greater than that of the flowable base component, the electrical conductance varies substantially continuously in a predetermined direction from a first portion to a second portion.

* * * * *